(12) United States Patent
Kim et al.

(10) Patent No.: US 6,187,676 B1
(45) Date of Patent: Feb. 13, 2001

(54) INTEGRATED CIRCUIT INSULATED ELECTRODE FORMING METHODS USING METAL SILICON NITRIDE LAYERS, AND INSULATED ELECTRODES SO FORMED

(75) Inventors: Min-Jung Kim, Kyunggi-do; Sang-Cheol Lee, Seoul; Byung-Hyug Roh, Kyunggi-do, all of (KR)

(73) Assignee: Samsung Electronics Co., Ltd. (KR)

( * ) Notice: Under 35 U.S.C. 154(b), the term of this patent shall be extended for 0 days.

(21) Appl. No.: 09/134,848

(22) Filed: Aug. 14, 1998

(30) Foreign Application Priority Data

Aug. 16, 1997 (KR) .................................. 97-39091

(51) Int. Cl.[7] ...................... H01L 21/4763; H01L 21/44; H01L 21/31; H01L 21/469
(52) U.S. Cl. .................. 438/656; 438/649; 438/655; 438/657; 438/785; 438/791
(58) Field of Search .................... 438/655, 656, 438/657, 785, 791, 649

(56) References Cited

U.S. PATENT DOCUMENTS

| 4,760,369 | 7/1988 | Tiku ...................... 338/308 |
| 5,066,615 | 11/1991 | Brady et al. .................. 437/229 |
| 5,962,904 | * 10/1999 | Hu ......................... 257/412 |
| 6,037,246 | * 3/2000 | Bhat ....................... 438/618 |

* cited by examiner

Primary Examiner—Charles Bowers
Assistant Examiner—Nona Berezny
(74) Attorney, Agent, or Firm—Myers Bigel Sibley & Sajovec

(57) ABSTRACT

Insulated electrodes are formed by first forming on an integrated circuit substrate, an insulating layer, a conductive layer on the insulating layer, and a metal silicide layer on the conductive layer, and then forming a metal silicon nitride layer on the metal silicide layer. The metal silicon nitride layer acts as a silicon protrusion-preventing layer on the metal silicide layer that prevents formation of silicon protrusions from the metal silicide layer during subsequent processing. Reliability and/or yield problems that are caused by undercutting of an insulation layer in an insulated electrode may also be reduced by forming on an integrated circuit substrate, an insulating layer, conductive layer on the insulating layer and a metal silicide layer on the conductive layer. The metal silicide layer and the conductive layer are selectively etched to define an insulated electrode including a sidewall while also undesirably undercutting the insulating layer relative to the conductive layer thereon to define an undercut region. A conformal silicon nitride layer is coated on the integrated circuit substrate, including on the sidewall and in the undercut region. The conformal silicon nitride layer plugs the undercut insulating layer with silicon nitride, to thereby reduce reliability and/or yield problems.

25 Claims, 6 Drawing Sheets

INTEGRATED CIRCUIT INSULATED ELECTRODE FORMING METHODS USING METAL SILICON NITRIDE LAYERS, AND INSULATED ELECTRODES SO FORMED

FIELD OF THE INVENTION

This invention relates to integrated circuit devices and fabrication methods, and more particularly to insulated electrodes for integrated circuits and methods of forming the same.

BACKGROUND OF THE INVENTION

Insulated electrodes are widely used in integrated circuit devices. For example, integrated circuit field effect transistors generally include spaced apart source and drain regions in an integrated circuit substrate with an insulated gate electrode on the substrate therebetween.

As the integration density of integrated circuits continues to increase, linewidths are being reduced to below a quarter micron. Unfortunately, as linewidths are reduced, it can become increasingly difficult to provide low resistance insulated electrodes with low defects. In order to provide low resistance insulated electrodes, multilayer electrodes including an insulating layer, a conductive layer on the insulating layer and a metal silicide layer on the conductive layer have been provided. For example, insulated gate electrodes including an oxide layer on an integrated circuit substrate, a doped polysilicon layer on the oxide layer and a metal silicide layer such as titanium silicide on the doped polysilicon layer, have been provided. Unfortunately, it may be difficult to fabricate these insulated electrodes at submicron linewidths with low defects.

Figure 1:
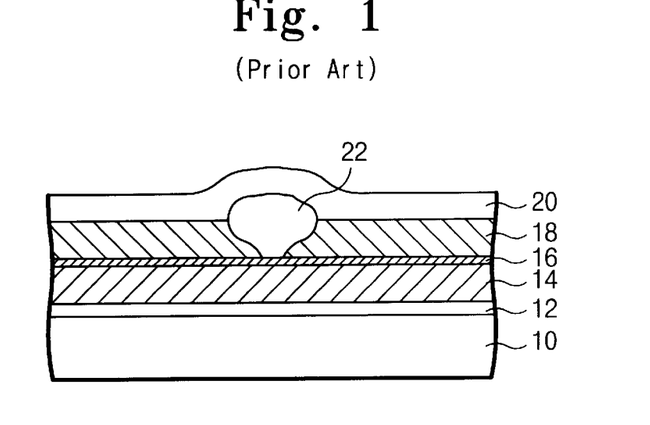
FIGS. 1–3 are cross-sectional views of conventional insulated electrodes
Figure 2:
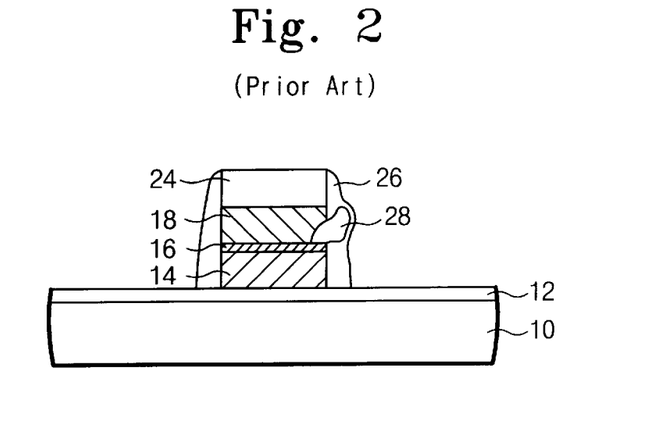

FIGS. 1 and 2 are cross-sectional views of conventional gate electrodes which illustrate the formation of undesired silicon protrusion defects in a metal silicide layer.

More specifically, referring to FIG. 1, a gate electrode includes a gate oxide layer 12 on an integrated circuit substrate, such as a silicon semiconductor substrate 10. A conductive polysilicon layer 14, a barrier metal layer 16 and a metal silicide layer 18 are formed on the gate oxide layer 12.

The metal silicide layer 18 may be titanium silicide, which may be formed by sputtering. During formation of the titanium silicide layer, an irregular region wherein the composition ratio of titanium and silicon is not uniform, may be formed.

After formation of the titanium silicide layer 18, an etch mask such as a layer of Low Pressure Chemical Vapor Deposited (LPCVD) silicon nitride 20 may be formed on the metal silicide layer 18. During formation of the LPCVD silicon nitride layer 20, the integrated circuit substrate may be exposed to a high temperature, for example about 760° C., that is higher than the phase transition temperature of the titanium silicide. Accordingly, the titanium suicide layer 18 forms a structure with the most stable composition ratio of titanium and silicon. However, surplus silicon in the titanium silicide layer 18 may form a silicon protrusion 22 which protrudes from the titanium silicide layer 18 into the silicon nitride layer 20. The silicon protrusion 22 can cause short circuits between adjacent gate electrodes, thereby impacting the reliability and/or yield of the integrated circuit.

FIG. 2 is a cross-sectional view of another embodiment of a conventional gate electrode. As was the case in FIG. 1, an insulating layer such as an oxide layer 12 is formed on an integrated circuit substrate, such as a silicon semiconductor substrate 10. A conductive layer such as a doped polysilicon layer 14, a barrier layer 16 and a metal silicide layer 18 are formed on the oxide layer 12. In contrast with FIG. 1, however, in order to reduce the growth of silicon protrusions 22, a Plasma Enhanced Chemical Vapor Deposited (PECVD) silicon nitride layer 24 is used as an etch mask, rather than an LPCVD silicon nitride layer. The PECVD silicon nitride 24 layer may be formed on the titanium silicide layer 18 at low temperatures, such as about 400° C.

A sidewall spacer 26 is also generally formed as part of a conventional self-aligned contact process. The sidewall spacer 26 may need to have the same etching selectivity as an interlayer insulating layer that is used for metal wiring, so that LPCVD silicon nitride is generally used for the sidewall spacer 26. Unfortunately, during the formation of the LPCVD silicon nitride sidewall spacer 26, a silicon protrusion 28 may be produced from the sidewall of the metal silicide layer 18. As was the case with FIG. 1, the silicon protrusion may impact yield and/or reliability of the integrated circuit device.

Figure 3:
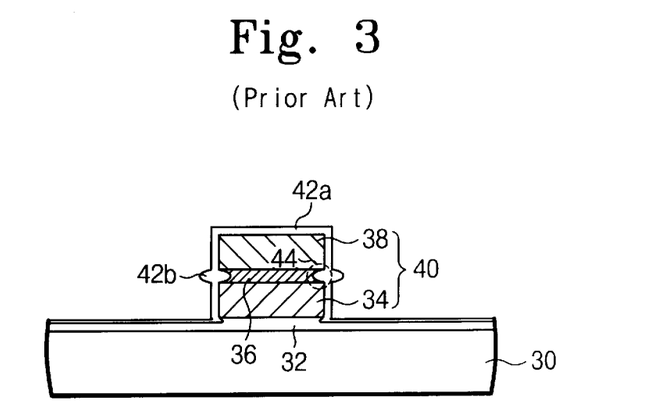

Other problems may also be created during fabrication of insulated electrodes. FIG. 3 illustrates undercutting of an electrode insulating layer, such as a gate oxide layer.

Specifically, as shown in FIG. 3, an insulating layer such as an oxide layer 32, a conductive layer such as a doped polysilicon layer 34, a barrier metal layer 36 and a metal silicide layer 38 are formed on an integrated circuit substrate such as a silicon semiconductor substrate 30, as was described above. A gate electrode 40 may be formed by etching the metal silicide layer 38, barrier layer 36 and polysilicon layer 34. When the barrier layer 36 is titanium nitride and the metal silicide layer is titanium silicide, an oxide layer 42b protruding from the sidewall of the barrier metal layer 36 may be formed when a gate oxidation process is performed. The oxide layer 32 may also be undercut.

Since the oxidation ratio of the barrier metal layer 36 may be higher than that of the polysilicon layer 34 or the metal silicide layer 38, the oxide layer 42b on the sidewall of the barrier metal layer 36 may be thicker than the oxide layer 42a on the polysilicon layer 34 or on the metal silicide layer 38. Accordingly, the lower edge portions 44 of the metal silicide layer 38 and the polysilicon layer 34 may become fragile. The undercutting of the oxide layer 32, may also create reliability and/or performance problems for the integrated circuit.

SUMMARY OF THE INVENTION

It is therefore an object of the present invention to provide improved insulated electrode forming methods for integrated circuits, and insulated electrodes so formed.

It is another object of the present invention to provide insulated electrode forming methods that can prevent silicon protrusions in metal silicide layers, and insulated electrodes so formed.

It is another object of the present invention to provide insulated electrode forming methods that can reduce performance and/or reliability problems due to electrode insulator undercutting, and insulated electrodes so formed.

These and other objects are provided according to the invention by insulated electrode forming methods that first form on an integrated circuit substrate, an insulating layer, a conductive layer on the insulating layer, and a metal suicide layer on the conductive layer, and then form a metal silicon nitride layer on the metal silicide layer. The metal silicon nitride layer acts as a silicon protrusion-preventing layer on the metal silicide layer that prevents formation of silicon protrusions from the metal silicide layer during subsequent processing.

In a first embodiment of the present invention, the metal silicide layer includes an outer surface opposite the conductive layer. The metal silicon nitride layer is formed on the outer surface of the metal silicide layer, to prevent formation of silicon protrusions from the outer surface of the metal silicide layer during subsequent processing. In a second embodiment, the metal silicide layer includes a sidewall and the metal silicon nitride layer is formed on the sidewall of the metal silicide layer, to prevent formation of silicon protrusions from the sidewall of the metal silicide layer during subsequent processing. The metal silicon nitride layer may also be on both the outer surface and the sidewall of the metal silicide layer.

In the first embodiment, after forming a metal silicon nitride layer on the outer surface of the metal silicide layer, a selective etch of the metal silicon nitride layer, the metal silicide layer and the conductive layer is performed, to define an insulated electrode including a sidewall. A sidewall spacer is then formed on the sidewall of the insulated electrode. In the second embodiment, the metal silicide layer first is selectively etched to define the sidewall and then the metal silicon nitride layer is formed on the sidewall of the metal silicide layer. A sidewall spacer is then formed on the metal silicon nitride layer. The metal silicon nitride layer may be formed by annealing the metal silicide layer in a nitrogen-containing ambient.

Integrated circuit insulated electrodes according to the invention comprise an insulating layer such as an oxide layer on an integrated circuit substrate such as a silicon semiconductor substrate, a conductive layer such as doped polysilicon on the insulating layer, a metal silicide layer on the conductive layer and a metal silicon nitride layer on the metal silicide layer. The metal silicon nitride layer acts as a silicon protrusion-preventing layer on the metal silicide layer that prevents formation of silicon protrusions from the metal silicide layer during subsequent processing.

The metal silicide layer may include an outer surface opposite the conductive layer, and the metal silicon nitride layer may be on the outer surface of the metal silicide layer. Alternatively, the metal silicide layer may include a sidewall, and the metal silicon nitride layer may be on the sidewall of the metal silicide layer. The metal silicon nitride layer may also be on both the outer surface and the sidewall of the metal silicide layer.

Reliability and/or yield problems that are caused by undercutting of an insulation layer in an insulated electrode may be reduced according to the invention by forming on an integrated circuit substrate, an insulating layer, conductive layer on the insulating layer and a metal silicide layer on the conductive layer. The metal silicide layer and the conductive layer are selectively etched to define an insulated electrode including a sidewall, while also undesirably undercutting the insulating layer relative to the conductive layer thereon to define an undercut region. A conformal silicon nitride layer is coated on the integrated circuit substrate, including on the sidewall and in the undercut region. The conformal silicon nitride layer plugs the undercut insulating layer with silicon nitride, to thereby reduce reliability and/or yield problems.

After coating the conformal silicon nitride layer, a sidewall spacer may be formed on the conformal silicon nitride layer on the sidewall. A barrier layer may also be included between the conductive layer and the metal silicide layer. When a barrier layer is included, a silicon nitride cap may also be formed on the barrier layer and on the sidewall of the insulated electrode, to thereby reduce reliability problems at the edge of the barrier layer, during the step of coating a conform silicon nitride layer.

Integrated circuit insulated electrodes that can reduce reliability and/or yield problems due to undercutting, include an insulating layer such as an oxide layer on an integrated circuit substrate such as a silicon semiconductor substrate and an electrode comprising a conductive layer such as doped polysilicon on the insulating layer and a metal silicide layer on the conductive layer that define a sidewall. The insulating layer is undercut relative to the conductive layer thereon to define an undercut region. A conformal silicon nitride layer is included on the integrated circuit substrate including on the sidewall and in the undercut region. The conformal silicon nitride layer acts as a silicon nitride plug that plugs the undercut insulating layer. The conformal silicon nitride layer also acts as a cap on a barrier layer, if included. A sidewall spacer may also be provided on the conformal nitride layer on the sidewall. Accordingly, improved insulated electrodes and fabrication processes may be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. Moreover, each embodiment described and illustrated herein includes its complementary conductivity type embodiment as well.

Figure 4A:
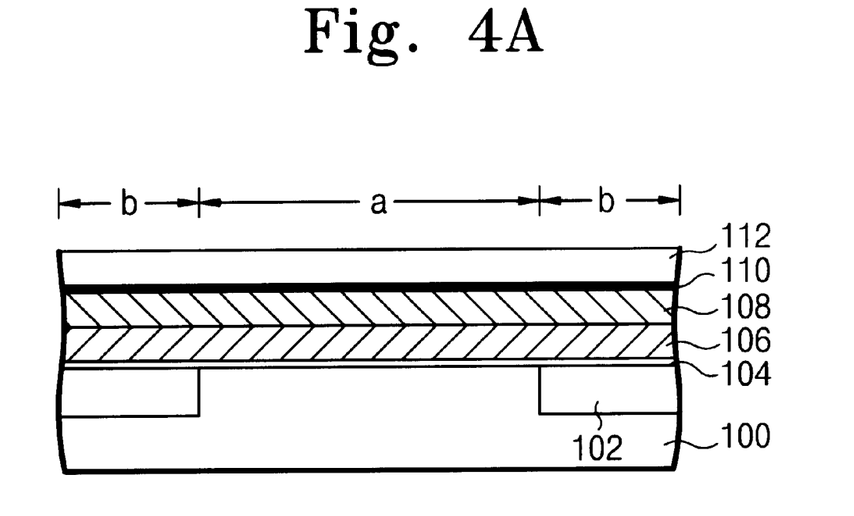
FIGS. 4A–4D are cross-sectional views of first embodiments of insulated electrodes during intermediate fabrication steps, according to the present invention.

FIGS. 4A–4D are cross-sectional views of first embodiments of insulated electrodes during intermediate fabrication steps, according to the present invention. Referring to FIG. 4A, field oxide regions 102 that define an active portion a and an inactive portion b of an integrated circuit substrate such as a silicon semiconductor substrate 100 are formed using conventional techniques. A gate insulating layer such as a gate oxide layer 104 is formed on the semiconductor substrate 100. The gate oxide layer 104 may have a thickness of about 70 Å. A conductive layer such as a conductive polysilicon layer 106 and a metal silicide layer 108 are then formed on the gate oxide layer 104. A thin metal silicon nitride layer 110 is formed on the metal silicide layer 108. It will be understood that a barrier metal layer may also be formed between the conductive polysilicon layer 106 and the metal silicide layer 108.

Details of the fabrication of metal silicide layer 108 and metal silicon nitride layer 110 will now be described. The metal silicide layer 108 may be a titanium silicide layer that can be formed by sputtering, Physical Vapor Deposition (PVD) or other conventional techniques. The thin metal silicon nitride layer 110 may have a thickness of about 20 Å and may be formed by annealing the metal silicide layer 108 in a nitrogen-containing ambient, for example an ambient including nitrogen gas ($N_2$) and/or ammonia ($NH_3$). Methods of fabricating metal silicon nitride layers are described in U.S. Pat. Nos. 4,760,369 and 5,066,615, the disclosures of which are hereby incorporated herein by reference.

Continuing with the description of FIG. 4A, an etch mask layer such as a first silicon nitride layer 112 may be formed using LPCVD in an $NH_3$ and $SiCl_2$ ambient at a temperature of about 760° C. The metal silicon nitride layer 110 prevents abnormal growth of silicon protrusions from the outer surface of the metal silicide layer 108 adjacent the metal silicon nitride layer 110, during the formation of the first LPCVD silicon nitride layer 112. Accordingly, the metal silicon nitride layer 110 acts as a silicon protrusion-preventing layer on the outer surface of the metal silicide layer 108, that prevents formation of silicon protrusions from the outer surface of the metal silicide layer during subsequent processing.

Figure 4B:
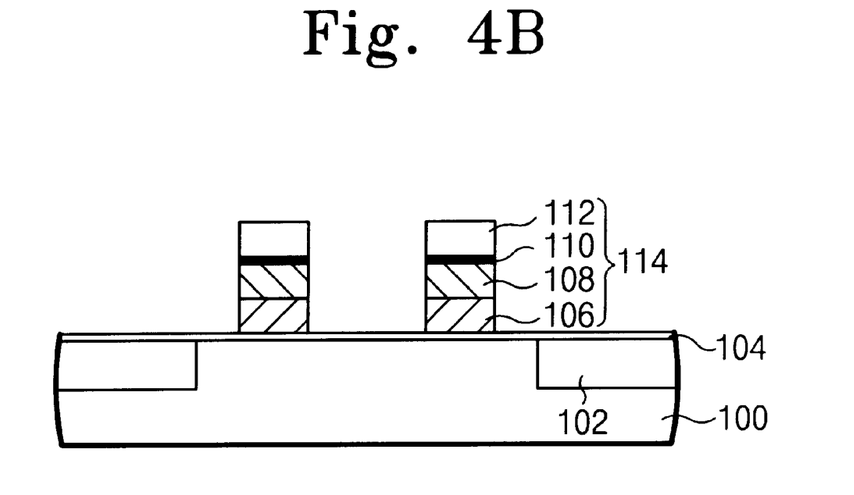

Referring now to FIG. 4B, a photoresist layer pattern that defines electrodes is formed on the first silicon nitride layer 112. The first silicon nitride layer 112 is etched using the photoresist. The photoresist may then be removed and the metal silicon nitride layer 110, the metal silicide layer 108 and the polysilicon layer 106 are selectively etched to form an electrode 114, using the first silicon nitride layer 112 as an etch mask.

Figure 4C:
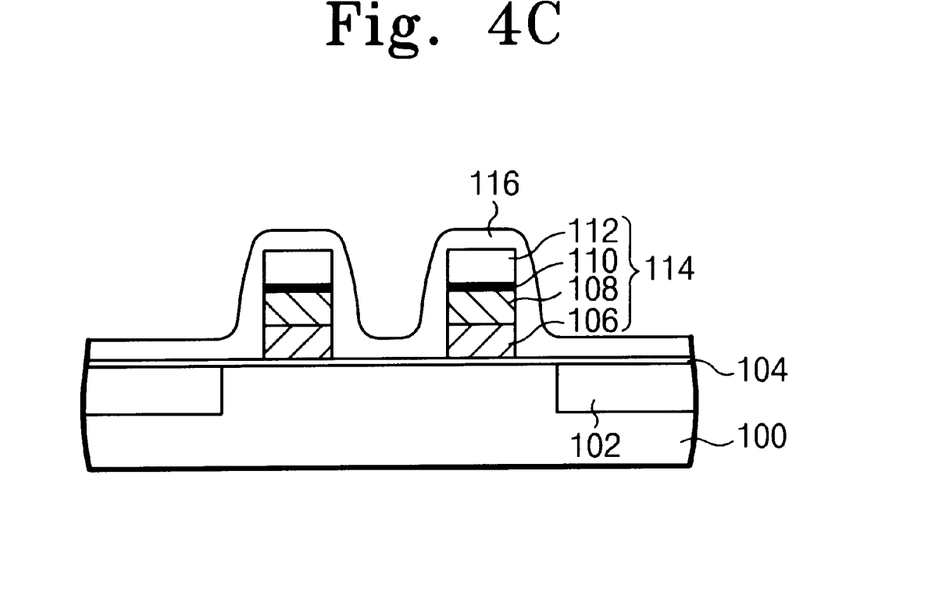

Referring now to FIG. 4C, a second silicon nitride layer 116 is formed on the integrated circuit substrate including on the gate oxide layer 104 and the gate electrode 114. LPCVD may be used to form the second silicon nitride layer 116. Silicon protrusion growth may be prevented because the metal silicide layer 108 was already exposed to high temperature thermal treatment when forming the first silicon nitride layer 112.

Figure 4D:
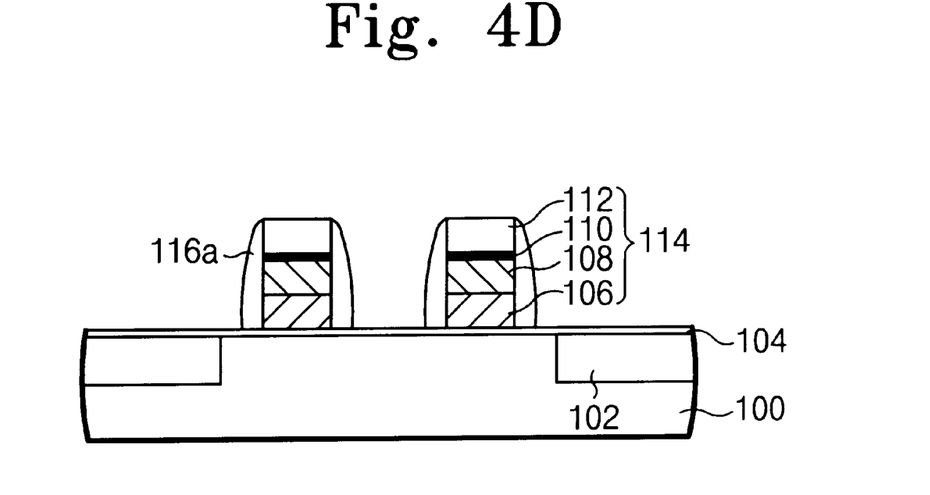

Finally, as shown in FIG. 4D, a sidewall spacer 116a is formed from the second silicon nitride layer 116 by etching the second silicon nitride layer 116. When the insulated electrode of FIG. 4D is a gate electrode of the field effect transistor, conventional processing may be used to form the field effect transistor. Other conventional processing may be used to form other integrated circuit structures, including an insulated electrode.

Figure 5A:
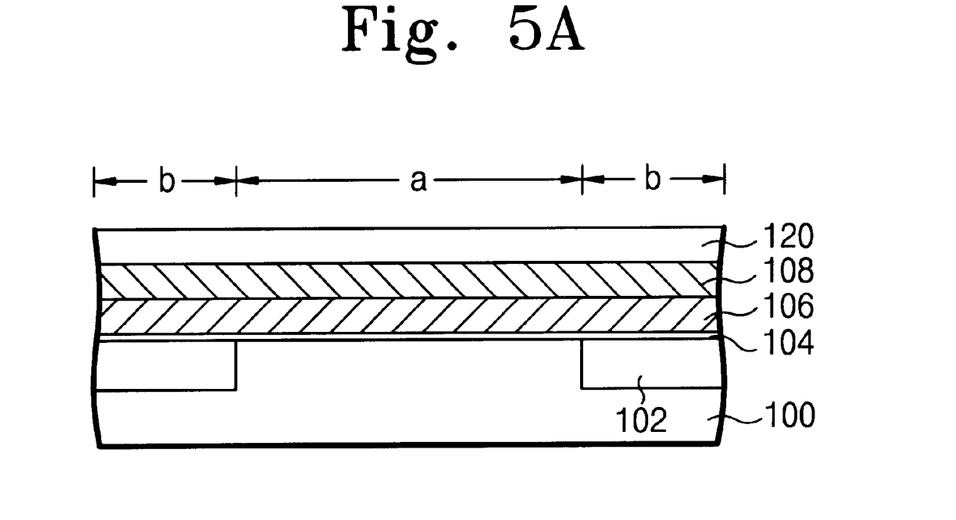
FIGS. 5A–5D are cross-sectional views of second embodiments of insulated electrodes during intermediate fabrication steps, according to the present invention.

FIGS. 5A–5D are cross-sectional views of second embodiments of insulated electrodes during intermediate fabrication steps, according to the present invention. As shown in FIG. 5A, field oxide regions 102, an insulating layer such as an oxide 104, a conductive layer such as a conductive polysilicon layer 106 and a metal silicide layer 108 are formed as was described in connection with FIG. 4A. As was also described, a barrier layer may also be included between the polysilicon layer 106 and the metal silicide layer 108.

Continuing with the description of FIG. 5A, a masking layer 120 may be formed of a first silicon nitride layer. In FIG. 5A, the first silicon nitride layer 120 is preferably formed by PECVD in an $NH_3$ and $SiCl_3$ ambient at a relatively low temperature of about 400° C. Accordingly, silicon protrusions are not formed in the metal silicide layer 108 during formation of the first silicon nitride layer 120.

Figure 5B:
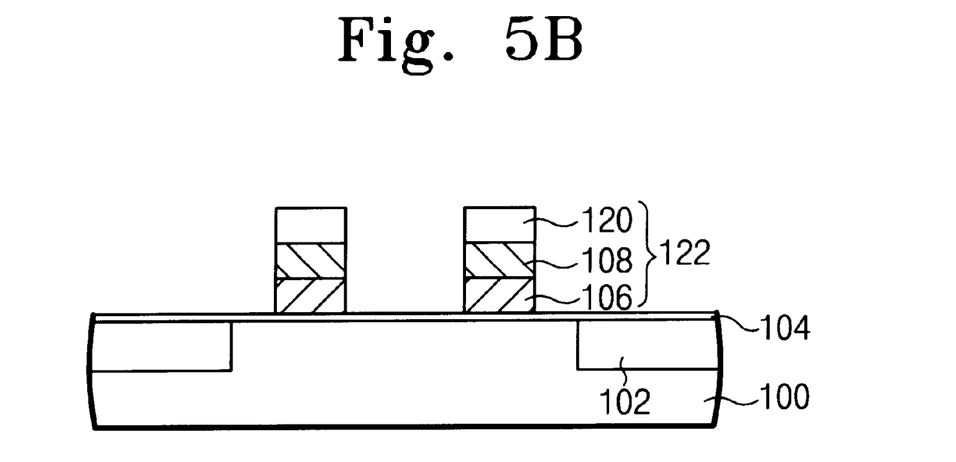

Referring now to FIG. 5B, an electrode 122 is then formed by selectively etching the first silicon nitride layer 120, the metal silicide layer 108 and the polysilicon layer 106, as was described in connection with FIG. 4B.

Figure 5C:
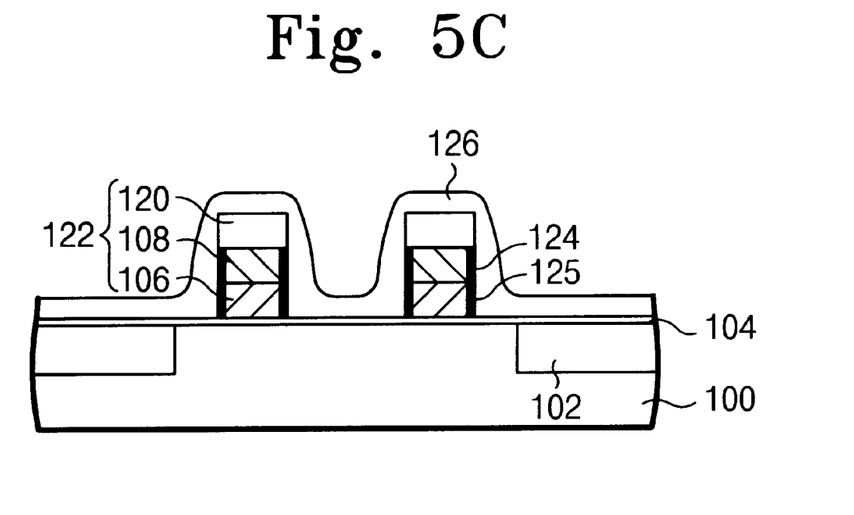

Referring now to FIG. 5C, a thin metal silicon nitride layer 124 is formed on the sidewall of the metal silicide layer 108. The thin metal silicon nitride layer 124 may be about 20 Å thick and may be formed by annealing in a nitrogen-containing ambient such as nitrogen gas and/or ammonia as described above. A thin second silicon nitride layer 125 may also be formed on the sidewall of the polysilicon layer 106.

Then, a third silicon nitride layer 126 is formed on the integrated circuit substrate 100 including on the gate oxide layer 104 and on the electrode 122. The third silicon nitride layer 126 is preferably formed by LPCVD so that it can have the same etch selectivity as an interlayer insulating layer that is used for metal wiring.

The thin metal silicon nitride layer 124 prevents abnormal growth of silicon protrusions from the sidewall of the metal silicide layer 108 during formation of the third silicon nitride layer 126. Accordingly, the metal silicon nitride layer 124 on the sidewall of the metal silicide layer 108 acts as a silicon protrusion-preventing layer on the sidewall of the metal silicide layer 108 that prevents formation of silicon protrusions from the sidewall of the metal silicide layer 108 during subsequent processing.

Figure 5D:
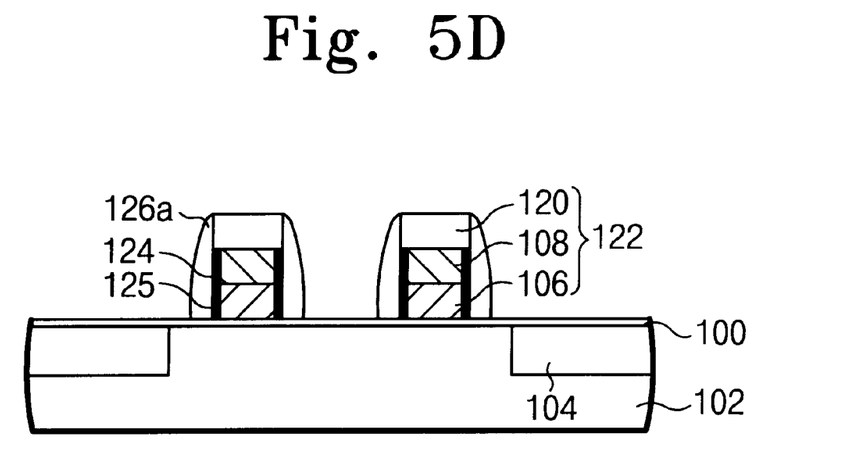

Finally, as shown in FIG. 5D, sidewall spacers 126a are formed from the third silicon nitride layer 126 by etching as was already described. Subsequent processing may also be performed as was already described.

Figure 6A:
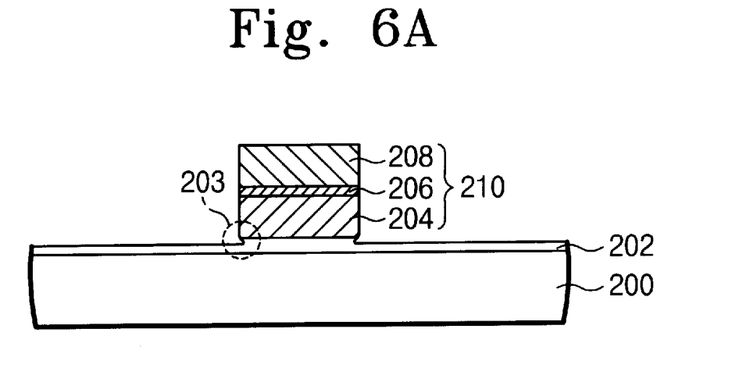
FIGS. 6A–6C are cross-sectional views of third embodiments of insulated electrodes during intermediate fabrication steps, according to the present invention.
Figure 6B:
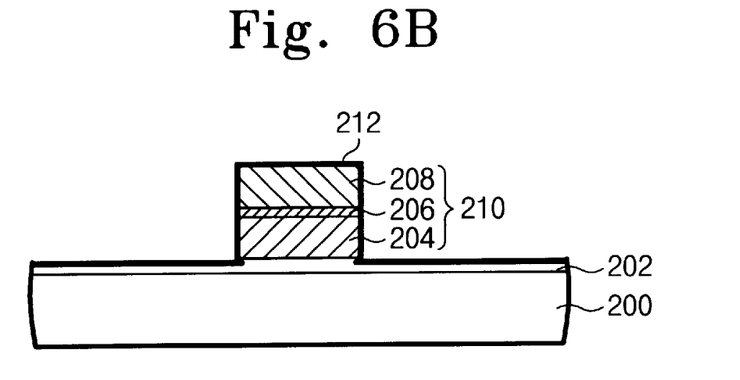
Figure 6C:
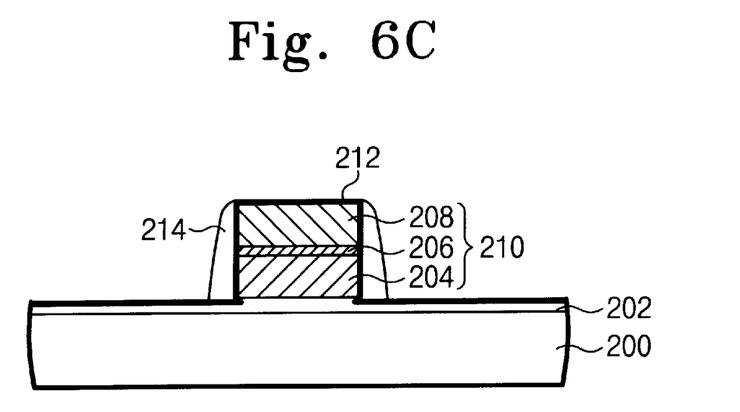

FIGS. 6A–6C are cross-sectional views of third embodiments of insulated electrodes during intermediate fabrication steps, according to the present invention.

Referring to FIG. 6A, an insulating layer such as a gate oxide layer 202 is formed at a thickness of about 70 Å on an integrated circuit substrate such as a silicon semiconductor substrate 100. A conductive layer such as a conductive polysilicon layer 204,. a barrier layer 206 and a metal silicide layer 208 are then formed and etched to form an electrode 210. The polysilicon layer 204 may lave a thickness of about 1000 Å, the barrier metal layer 206 may be titanium nitride having a thickness of about 50 Å and the metal silicide layer 208 may be a titanium silicide layer having a thickness of about 1000 Å.

As also shown in FIG. 6A, during etching to form the gate electrode 210, the gate oxide layer 202 is undercut beneath the polysilicon layer 204, to define an undercut region 203. This undercutting may produce performance and/or reliability problems.

Referring now to FIG. 6B, a conformal silicon nitride layer 212 is coated on the integrated circuit substrate including on the sidewall of the electrode 210 and in the undercut region 203. The conformal silicon nitride layer 212 plugs the undercut insulating layer with silicon nitride and can also reduce consumption of the barrier metal layer 206 at the sidewall thereof. The conformal silicon nitride layer 212 may be formed by Rapid Thermal Nitridation (RTN) at between about 850° C. and about 950° C. for about ninety seconds. RTN may be performed using an ambient of $NH_3$ and $SiH_4$, for example using $NH_3$ plasma and a low pressure tube. Alternatively, RTN may be performed using $NH_3$ gas flow followed by a mixture of $NH_3$ and $SiH_4$. RTN is well known to those having skill in the art and need not be described further herein.

Finally, as shown in FIG. 6C, a sidewall spacer 214 is formed on the sidewall of the electrode 210. Subsequent processing may be performed as was described above. Accordingly, the performance and/or reliability of insulated electrodes such as insulated gate electrodes may be enhanced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an insulated electrode on an integrated circuit substrate comprising the steps of:

first forming on an integrated circuit substrate, an insulating layer, a conductive layer on the insulating layer and a metal silicide layer on the conductive layer that includes an outer surface opposite the conductive layer; and then forming a metal silicon nitride layer on the outer surface of the metal silicide layer.

2. A method according to claim 1 wherein the metal silicide layer includes a sidewall and wherein the then forming step comprises the step of:

then forming a metal silicon nitride layer on the sidewall of the metal silicide layer.

3. A method according to claim 1 wherein the then forming step is followed by the step of:

selectively etching the metal silicon nitride layer, the metal silicide layer and the conductive layer to define an insulated electrode including a sidewall.

4. A method according to claim 3 wherein the selectively etching step is followed by the step of:

forming a sidewall spacer on the sidewall of the insulated electrode.

5. A method according to claim 2 wherein the following step is performed between the steps of first forming and then forming:

selectively etching the metal silicide layer to define the sidewall.

6. A method according to claim 2 wherein the then forming step is followed by the step of:

forming a sidewall spacer on the metal silicon nitride layer.

7. A method according to claim 1 wherein the conductive layer is a conductive polysilicon layer and wherein the insulated electrode is an insulated gate electrode.

8. A method according to claim 1 wherein the then forming step comprises the step of then forming a metal silicon nitride layer on the outer surface of the metal silicide layer by annealing the metal silicide layer in a nitrogen-containing ambient.

9. A method according to claim 1 wherein the first forming step comprises the step of first forming on an integrated circuit substrate, an insulating layer, a conductive layer on the insulating layer, a barrier layer on the conductive layer and a metal silicide layer on the barrier layer.

10. A method of forming an insulated electrode on an integrated circuit substrate comprising the steps of:

first forming on an integrated circuit substrate, an insulating layer, a conductive layer on the insulating layer and a metal silicide layer on the conductive layer that includes an outer surface opposite the conductive layer; and then forming a silicon protrusion-preventing layer on the outer surface of the metal silicide layer that prevents formation of silicon protrusions from the metal silicide layer during subsequent processing.

11. A method according to claim 10 wherein the metal silicide layer includes a sidewall and wherein the then forming step comprises the step of:

then forming a silicon protrusion-preventing layer on the sidewall of the metal silicide layer that prevents formation of silicon protrusions from the sidewall of the metal silicide layer during subsequent processing.

12. A method according to claim 10 wherein the then forming step is followed by the step of:

selectively etching the metal silicon nitride layer, the metal silicide layer and the conductive layer to define an insulated electrode including a sidewall.

13. A method according to claim 12 wherein the selectively etching step is followed by the step of:

forming a sidewall spacer on the sidewall of the insulated electrode.

14. A method according to claim 11 wherein the following step is performed between the steps of first forming and then forming:

selectively etching the metal silicide layer to define the sidewall.

15. A method according to claim 11 wherein the then forming step is followed by the step of:

forming a sidewall spacer on the silicon protrusion-preventing layer.

16. A method according to claim 10 wherein the conductive layer is a conductive polysilicon layer and wherein the insulated electrode is an insulated gate electrode.

17. A method according to claim 10 wherein the first forming step comprises the step of first forming on an integrated circuit substrate, an insulating layer, a conductive layer on the insulating layer, a barrier layer on the conductive layer and a metal silicide layer on the barrier layer.

18. A method of forming an insulated electrode on an integrated circuit substrate comprising the steps of:

forming on an integrated circuit substrate, an insulating layer, a conductive layer on the insulating layer and a metal silicide layer on the conductive layer;

selectively etching the metal silicide layer and the conductive layer to define an insulated electrode including a sidewall while also undercutting the insulating layer relative to the conductive layer thereon to define an undercut region; and coating a conformal silicon nitride layer on the integrated circuit substrate, including on the sidewall and in the undercut region.

19. A method according to claim 18 further comprising the step of forming a sidewall spacer on the conformal silicon nitride layer on the sidewall.

20. A method according to claim 18 wherein the conductive layer is a conductive polysilicon layer and wherein the insulated electrode is an insulated gate electrode.

21. A method according to claim 18:

wherein the forming step comprises the step of forming on an integrated circuit substrate, an insulating layer, a conductive layer on the insulating layer, a barrier layer on the conductive layer and a metal silicide layer on the barrier layer; and wherein the selectively etching step comprises the step of selectively etching the metal silicide layer, the barrier layer and the conductive layer to define an insulated electrode including a sidewall while also undercutting the insulating layer relative to the conductive layer thereon to define an undercut region.

22. A method of forming an insulated electrode on an integrated circuit substrate comprising the steps of:

forming on an integrated circuit substrate, an insulating layer, a conductive layer on the insulating layer and a metal silicide layer on the conductive layer;

selectively etching the metal silicide layer and the conductive layer to define an insulated electrode including a sidewall while also undercutting the insulating layer relative to the conductive layer thereon; and plugging the undercut insulating layer with silicon nitride.

23. A method according to claim 22 further comprising the step of forming a sidewall spacer on the sidewall.

24. A method according to claim 22 wherein the conductive layer is a conductive polysilicon layer and wherein the insulated electrode is an insulated gate electrode.

25. A method according to claim 22:

wherein the forming step comprises the step of forming on an integrated circuit substrate, an insulating layer, a conductive layer on the insulating layer, a barrier layer on the conductive layer and a metal silicide layer on the barrier layer;

wherein the selectively etching step comprises the step of selectively etching the metal silicide layer, the barrier layer and the conductive layer to define an insulated electrode including a sidewall while also undercutting the insulating layer relative to the conductive layer thereon; and wherein the plugging step comprises the step of plugging the undercut insulating layer with silicon nitride while simultaneously forming a silicon nitride cap on the barrier layer at the sidewall.

* * * * *